(12) United States Patent
Furuichi

(10) Patent No.: US 6,465,817 B1
(45) Date of Patent: Oct. 15, 2002

(54) SEMICONDUCTOR INTEGRATED CIRCUIT AND DIGITAL CAMERA COMPRISING THE SAME

(75) Inventor: Shinji Furuichi, Shiga (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/666,478

(22) Filed: Sep. 20, 2000

(30) Foreign Application Priority Data

Sep. 24, 1999 (JP) .............................. 11-270839
Aug. 30, 2000 (JP) .......................... 2000-261938

(51) Int. Cl.⁷ ............................................... H01L 27/10
(52) U.S. Cl. ..................... 257/202; 365/201; 365/233
(58) Field of Search ................................. 365/201, 233; 438/3; 716/8, 10, 12, 17, 18

(56) References Cited

U.S. PATENT DOCUMENTS 6,275,428 B1 * 8/2001 Fukuda et al. .............. 365/201

* cited by examiner

*Primary Examiner*—David Nelms
*Assistant Examiner*—Mai-Huong Tran
(74) *Attorney, Agent, or Firm*—McDermott, Will & Emery

(57) ABSTRACT

A semiconductor integrated circuit capable of speeding up its operations and improving the degree of integration is obtained. This semiconductor integrated circuit comprises a macro cell part and a logic part formed around the macro cell part. The macro cell part includes a logic wiring region for receiving wires provided in the logic part. Thus, such a probability that the wires of the logic circuit bypass the macro cell part is reduced, whereby the wiring length of the wires of the logic part is reduced to reduce the wiring capacity while the wires are prevented from congestion around the macro cell part. Consequently, the circuit operations are speeded up and the degree of integration of the semiconductor integrated circuit is improved.

14 Claims, 7 Drawing Sheets

PRIOR ART

SEMICONDUCTOR INTEGRATED CIRCUIT AND DIGITAL CAMERA COMPRISING THE SAME

BACKGROUND OF THE INVENTION

1. Field of the Invention

The present invention relates to a semiconductor integrated circuit and a digital camera comprising the same, and more specifically, it relates to a semiconductor integrated circuit having a large-scale macro cell part such as a CPU and a digital camera comprising the same.

2. Description of the Prior Art

A semiconductor integrated circuit forming a logic circuit responsive to the specification of a target system (e.g., a digital camera) around a core of a large-scale macro cell part such as a CPU on a single semiconductor substrate is well known in general.

An ASIC (application specific integrated circuit) readily implementing a device for a specific application with CAD (computer aided design) is generally known as a method employed for forming the aforementioned semiconductor integrated circuit. As to a method of designing such an ASIC, a gate array system, a standard cell system and an embedded array system are generally known as methods of efficiently designing semi-custom LSIs.

In the gate array system, basic cells covered with transistors in an arrayed manner are provided and wired for forming a logic circuit. The gate array system requires only a wiring step as the fabrication step, and hence a TAT (turnaround time) between completion of design and trial manufacture of a sample is advantageously reduced.

However, a large-scale macro cell part such as a CPU or a memory cannot be formed by the gate array system.

On the other hand, such a large-scale macro cell part can be readily implemented by the standard cell system. In the standard cell system, optimally designed verified logic circuit cells and a macro cell part are previously registered in a CAD database and arbitrarily combined with each other through CAD. However, this standard cell system employs a mask specific to a type from a transistor forming step, and hence fabrication cannot be started until the design is completed. In the standard cell system, therefore, the TAT is inconveniently lengthened as compared with the gate array system.

To this end, there is proposed the embedded array system having a structure embedding a macro cell part of standard cells in a random logic part of a gate array. The embedded array system adopts advantages of the gate array system and the standard cell system. After deciding the number of gates of the random logic part and the type of the embedded macro cell part, fabrication of a wafer is immediately started to advance fabrication of the embedded array up to a stage preceding a wiring step. Completion of logical design is waited in this state. After termination of a logic simulation, an LSI is completed by simply wiring the random logic part.

In the embedded array system, the macro cell part of the standard cells is previously registered and hence parts other than the macro cell part are designed. Therefore, the macro cell part of the standard cells may not be embodied to a transistor unit level and hence the TAT can be reduced for the standard cells. Further, circuits forming the random logic part can be changed only through the wiring step.

When the overall semiconductor integrated circuit is wired in the aforementioned conventional embedded array system, the macro cell part is treated as a black box having only an input/output port and a power supply port connected to the macro cell part and boundary information indicating the magnitude of the macro cell part as pattern information. In other words, the random logic part is wired/designed on the basis of only the boundary information indicating the magnitude of the macro cell part regardless of detailed information on the inner part of the macro cell part in the conventional embedded array system, in order to reduce the quantity of data. When wires are provided on the macro cell part of the standard cells for wiring the random logic part, therefore, these wires may come into contact with and short to internal wires of the macro cell part.

In general, therefore, a macro cell part 153 must be regarded as an inhibit area for wires 152 of a random logic part 151 when wiring the random logic part 151 as shown in FIG. 12, so that the wires 152 bypass the macro cell part 153. Consequently, wiring efficiency is disadvantageously reduced around the macro cell part 153 to hinder improvement in degree of integration. Further, the wiring length of the wires 152 is increased to increase wiring capacity. Thus, the semiconductor integrated circuit is disadvantageously inhibited from speeding up its operations.

SUMMARY OF THE INVENTION

An object of the present invention is to provide a semiconductor integrated circuit capable of improving the degree of integration and speeding up its operations.

Another object of the present invention is to reduce the wiring length of a logic part of a semiconductor integrated circuit thereby reducing wiring capacity.

Still another object of the present invention is to provide a digital camera having the aforementioned semiconductor integrated circuit.

A semiconductor integrated circuit according to an aspect of the present invention comprises a macro cell part and a logic part formed around the macro cell part. The macro cell part includes a logic wiring region for receiving a wire provided in the logic part.

In the semiconductor integrated circuit according to this aspect, the macro cell part is formed to include the logic wiring region for receiving the wire provided in the logic part, whereby the wire in the logic part can be provided in the macro cell part. Thus, such a probability that the wire of the logic part must bypass the macro cell part can be reduced. Therefore, the wiring length of the wire provided in the logic part is so reduced that wiring capacity can be reduced while the wire can be prevented from congestion around the macro cell part. Consequently, circuit operations can be speeded up while the degree of integration of the semiconductor integrated circuit can be improved.

In the semiconductor integrated circuit according to this aspect, the logic wiring region of the macro cell part preferably includes a region substantially provided with no internal wire of the macro cell part. Thus, the wire of the logic part will not come into contact with the internal wire of the macro cell part when the same is provided on the logic wiring region of the macro cell part. The logic wiring region of the macro cell part may include a region provided with an internal wire of the macro cell part to an extent not hindering provision of the wire of the logic part. Also in this case, the wire of the logic part can be provided on the logic wiring region of the macro cell part.

In the semiconductor integrated circuit according to this aspect, the logic wiring region of the macro cell part is preferably provided on a peripheral portion of the macro cell part. The internal wire of the macro cell part tends to congest rather on a central portion than on the peripheral portion. When providing the logic wiring region on the peripheral portion of the macro cell part in the aforementioned manner, therefore, the macro cell part can be readily designed. In this case, the logic wiring region is preferably provided on a corner portion, an upper edge portion and a lower edge portion of the macro cell part. Alternatively, the logic wiring region may be provided along a peripheral portion of the macro cell part over the whole area of the peripheral portion. Further alternatively, the logic wiring region may be provided on a corner portion and both side edge portions of the macro cell part.

In the semiconductor integrated circuit according to this aspect, the logic wiring region of the macro cell part may be provided on a central portion of the macro cell part in the form of a strip.

In the semiconductor integrated circuit according to this aspect, each of the macro cell part and the logic part preferably has a multilayer wiring structure, and the logic wiring region is preferably formed on at least one layer of the macro cell part. When the macro cell part has such a multilayer wiring structure, the logic wiring region can be readily provided in the macro cell part. In this case, the logic wiring region is preferably provided over a plurality of layers of the macro cell part.

In the semiconductor integrated circuit according to this aspect, each of the macro cell part and the logic part preferably has a multilayer wiring structure, and the logic wiring region is preferably provided substantially over the whole area of a prescribed layer of the macro cell part. Thus, the logic wiring region can be provided substantially over the whole area of the prescribed layer of the macro cell part on the premise that the macro cell part has a multilayer wiring structure. Thus, such a probability that the wire of the logic part must bypass the macro cell part can be substantially nullified. Therefore, the total wiring length of the wire in the logic part is so reduced that the wiring capacity can be further reduced, while the wire can be more effectively prevented from congesting around the macro cell part. Consequently, the circuit operations can be further speeded up and the degree of integration of the semiconductor integrated circuit can be further improved.

In the semiconductor integrated circuit according to this embodiment, each of the macro cell part and the logic part preferably has a multilayer wiring structure, and the wire of the logic part provided on the logic wiring region of the macro cell part and an internal wire of the macro cell part are preferably prepared from the same layer. Thus, the wire of the logic part provided on the logic wiring region of the macro cell part and the internal wire of the macro cell part can be simultaneously formed for simplifying the fabrication process.

In the semiconductor integrated circuit according to this aspect, each of the macro cell part and the logic part preferably has a multilayer wiring structure, and an underlayer surface for the wire of the logic part provided on the logic wiring region of the macro cell part and the upper surface of the logic wiring region of the macro cell part are preferably substantially flush with each other. Thus, it is possible to effectively prevent occurrence of a step between the wire of the logic part provided on the logic wiring region of the macro cell part and the logic wiring region of the macro cell part. Consequently, the wire of the logic part can be naturally passed through the logic wiring region of the macro cell part.

A digital camera according to another aspect of the present invention comprises a semiconductor integrated circuit including a macro cell part and a logic part formed around the macro cell part. The macro cell part includes a logic wiring region for receiving a wire provided in the logic part. According to this structure, the wire provided in the logic part can be provided on the logic wiring region of the macro cell part. Thus, such a probability that the wire of the logic part bypasses the macro cell part can be reduced. Therefore, the wiring length is so reduced that wiring capacity can be reduced while the wire can be prevented from congestion around the macro cell part. Consequently, it is possible to provide a digital camera capable of speeding up circuit operations and improving the degree of integration of the semiconductor integrated circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
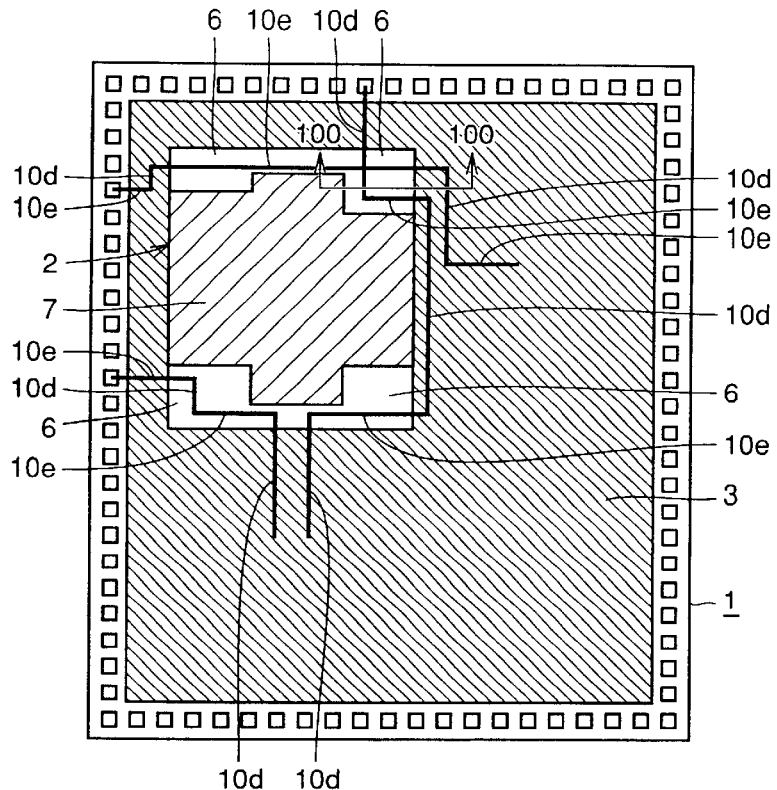
FIG. 1 is a plan view schematically showing the structure of a semiconductor integrated circuit according to a first embodiment of the present invention.
Figure 2:
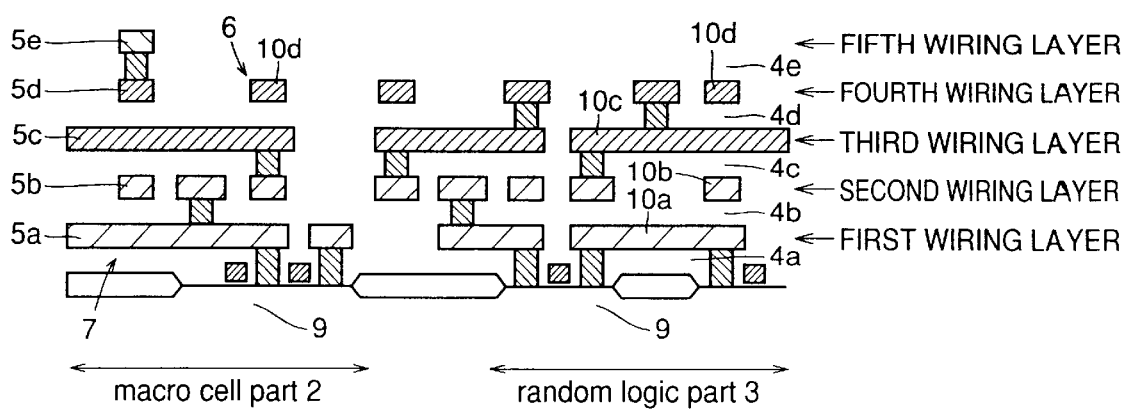
FIG. 2 is a sectional view of the semiconductor integrated circuit according to the first embodiment taken along the line 100—100 in FIG. 1.

Referring to FIGS. 1 and 2, a semiconductor integrated circuit 1 according to a first embodiment of the present invention comprises a large-scale macro cell part 2 and a random logic part 3. The macro cell part 2 forms a RISC-CPU, a CISC-CPU, a RAM or a ROM designed in the standard cell system. The random logic part 3, provided around the macro cell part 2, is designed by the gate array system (including a master slice system). In other words, the semiconductor integrated circuit 1 is an ASIC for a specific application according to the embedded array system formed by building the macro cell part 2 of standard cells into the random logic part 3 of a gate array on a single semiconductor substrate.

As shown in FIG. 2, the macro cell part 2 basically has five layers of internal wires 5a, 5b, 5c, 5d and 5e. Interlayer isolation films 4a, 4b, 4c, 4d and 4e isolate the internal wires 5a to 5e from each other respectively. The fourth-layer internal wire 5d and the fifth-layer internal wire 5e are concentrated to the central side of the macro cell part 2, thereby forming regions 6 (hereinafter referred to as internal unwired regions 6) having no internal wires 5 on the four corners in the fourth and fifth layers and upper and lower edge portions of the macro cell part 2. In other words, the macro cell part 2 is formed by first- to fifth-layer internal wiring regions 7 and the internal unwired regions 6 located on the four corners in the fourth and fifth layers and the upper and lower edge portions. The internal wires 5a to 5e are connected in the internal wiring regions 7 for completing logic, thereby implementing functions of the macro cell part 2.

Figure 3:
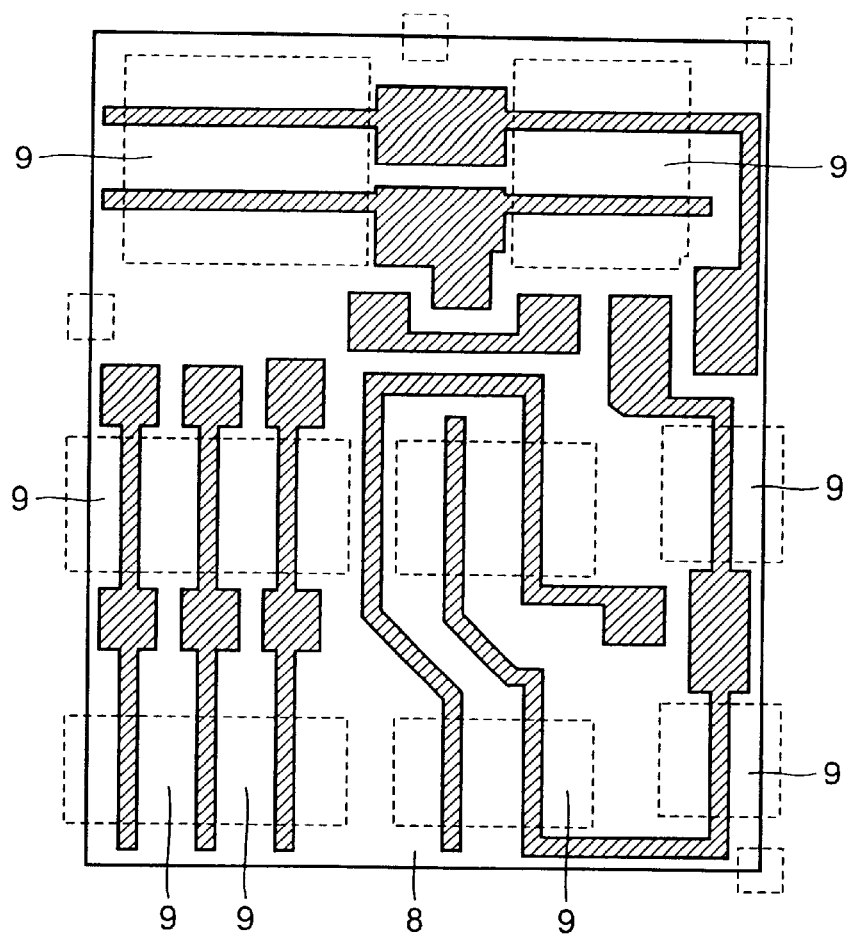
FIG. 3 is a plan view schematically showing the structure of a basic cell of a random logic part according to the first embodiment shown in FIG. 1.
Figure 4:
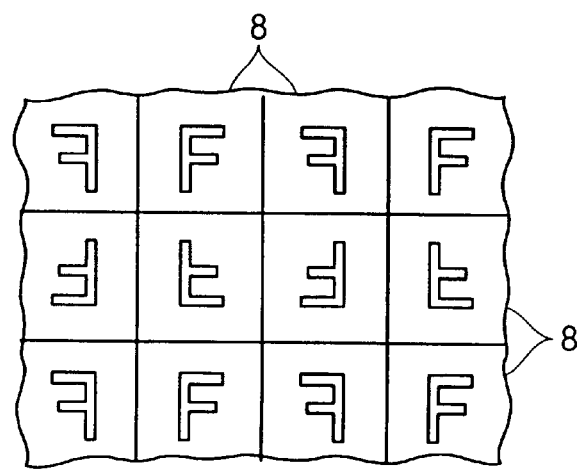
FIG. 4 is a schematic diagram for illustrating the structure of arrangement of the basic cells of the random logic part shown in FIG. 3.

The random logic part 3 is covered with basic cells 8, each having a structure shown in FIG. 3, for example, in arrangement/orientation shown in FIG. 4, for example, in order to implement various signal processing functions. Respective transistors 9 provided on the respective basic cells 8 are connected with each other through first- and second-layer metal wires 10a and 10b, thereby forming a logic circuit such as a flip-flop circuit, an inverter, a buffer, a NAND circuit, a NOR circuit, an AND circuit, an OR circuit, an AND-NOR circuit, an OR-NAND circuit, an exclusive OR circuit, an exclusive NOR circuit, a multiplexer, an adder, a half-adder, a recorder or a latch circuit, for example.

The random logic part 3 is formed through the same process as the macro cell part 2. In other words, the random logic part 3 has five layers of metal wires similarly to the internal wiring regions 7 of the macro cell part 2.

According to the first embodiment, the internal unwired regions 6 are provided in the fourth and fifth layers of the macro cell part 2, as hereinabove described. In the section shown in FIG. 2, the fourth-layer metal wire 10d of the random logic part 3 is provided in the fourth-layer internal unwired region 6 of the macro cell part 2. Among the metal wires shown in FIG. 1, the vertical ones are formed by the fourth-layer wires 10d and the transverse ones are formed by the fifth-layer metal wires 10e. In the section taken along the line 100—100 in FIG. 1, therefore, the fourth-layer vertical metal wire 10d appears in the internal unwired region 6 of the macro cell part 2, as shown in FIG. 2.

A method of designing the semiconductor integrated circuit 1 according to the first embodiment having the aforementioned structure is now described.

In an embedded array, cells (such as the basic cells 8 of the macro cell part 2 and the random logic part 3) for implementing various functions are registered on a CAD database.

In the design flow for the semiconductor integrated circuit 1, design steps are carried out in order of specification design→functional design→logical design →circuit design→layout design.

In the specification design, implementability is closely examined as to factors of the logic LSI such as a specific application, the cost, target performance, stored functions and compatibility with conventional apparatuses. The external specification is designed in consideration of consistency between these factors.

In the functional design, a functional block diagram expressing both the flow of data and the idea of control along with principal hardware is created. On the basis of this functional block diagram, detailed function description describing all functions in detail with a hardware description language is created. Then, the detailed function description is applied to a functional simulator for functional verification.

In the logical design, the functional block diagram and the detailed function description are converted to specific hardware for creating a logic diagram (net list).

In the layout design, a circuit embodying the logic expressed in the net list to a level enabling pattern design is designed to create a circuit diagram. Pattern design is performed on the basis of this circuit diagram to create a pattern diagram. Then, a mask for embodying elements forming the circuit diagram and wires connecting the elements on a semiconductor substrate is created on the basis of the pattern diagram.

According to the first embodiment, CAD is fully used in this layout design for deciding the layout of the macro cell part 2 and the random logic part 3. A mask for a master wafer is created on the basis of the result of the layout. This mask is used for fabricating a master wafer through a general wafer process.

In the first embodiment, the internal unwired regions 6 may be previously provided in the layout design of the macro cell part 2 itself or may be found out from the macro cell part 2 after the layout design of the macro cell part 2. Thereafter the layout of the random logic part 3 is designed on the basis of information on the internal unwired regions 6.

In other words, CAD is fully used with the result of the layout of the macro cell part 2 and the net list for automatically providing the wires on the remaining random logic part 3. At this time, the internal wiring regions 7 of the macro cell part 2 are set as inhibit regions for the metal wires 10d and 10e of the random logic part 3 while the internal unwired regions 6 of the macro cell part 2 are not set as inhibit regions for the metal wires 10d and 10e of the random logic part 3. Thus, the fourt-hand fifth-layer metal wires 10d and 10e can be provided on the fourth- and fifth-layer internal unwired regions 6.

A mask is created on the basis of this result. This mask is employed for actually forming the metal wires 10d and 10e on the master wafer. Consequently, the fourth- and fifth-layer metal wires 10d and 10e are so provided as to pass through the internal unwired regions 6 without bypassing the macro cell part 2, as shown in FIG. 1.

The internal unwired regions 6, preferably provided with absolutely no internal wires 5, may have the internal wires 5d and 5e to an extent not hindering provision of the metal wires 10d and 10e.

According to the aforementioned first embodiment, the fourth- and fifth-layer metal wires 10d and 10e of the random logic part 3 can be provided on the internal unwired regions 6 of the macro cell part 2, thereby reducing such a probability that the metal wires 10d and 10e must bypass the macro cell part 2. Thus, the total wiring length of the metal wires 10d and 10e is reduced to reduce wiring capacity while congestion of the metal wires 10d and 10e is canceled around the macro cell part 2. Consequently, the circuit operations can be speeded up and the degree of integration of the semiconductor integrated circuit 1 can be improved.

Further, the macro cell part 2 and the random logic part 3 are formed through the same process so that substantially no step is defined therebetween in each layer. In other words, the macro cell part 2 and the random logic part 3 are so formed through the same process that the upper surfaces of the interlayer isolation films 4d and 4e for the internal unwired regions 6 of the macro cell part 2 and the upper surfaces of the interlayer isolation films 4d and 4e serving as underlayers for the metal wires 10d and 10e of the random logic part 3 are flush with each other. Consequently, the fourth- and fifth-layer metal wires 10d and 10e can be naturally provided on the upper surfaces of the interlayer isolation films 4d and 4e for the internal unwired regions 6.

According to the aforementioned first embodiment, the margin for the wires of the macro cell part 2 can be improved by forming the macro cell part 2 and the random logic part 3 in the multilayer wiring structure of five layers. Thus, the internal unwired regions 6 can be readily formed in the macro cell part 2.

(Second Embodiment)

Figure 5:
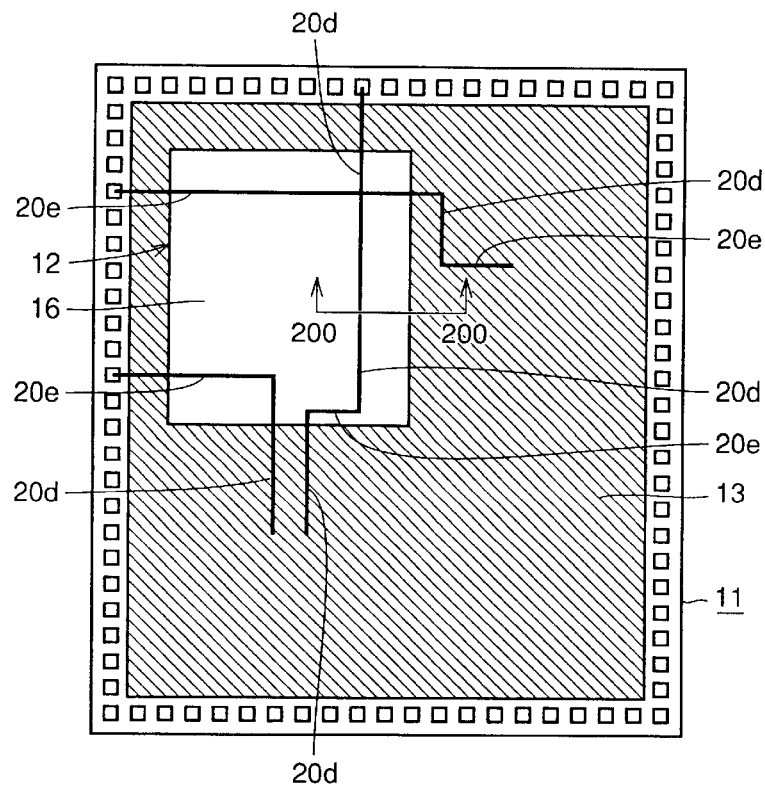
FIG. 5 is a plan view showing a semiconductor integrated circuit according to a second embodiment of the present invention.
Figure 6:
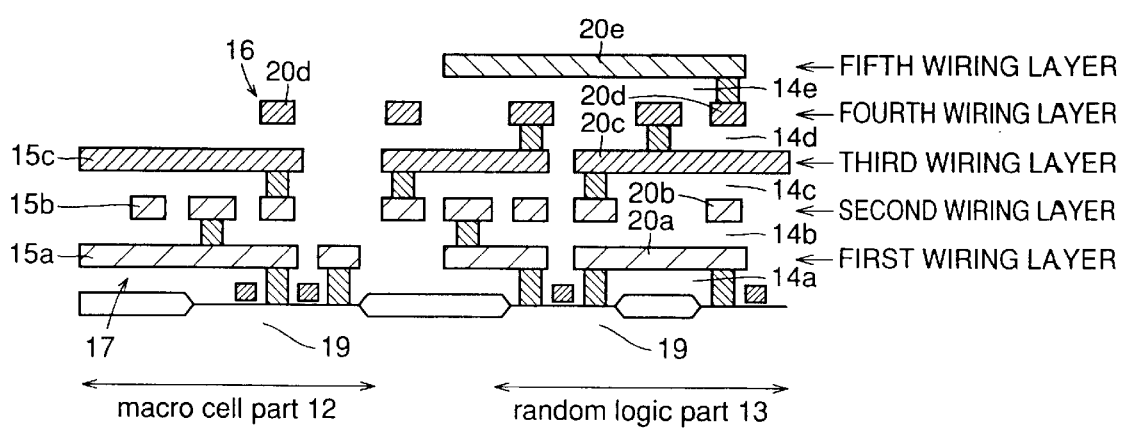
FIG. 6 is a sectional view of the semiconductor integrated circuit according to the second embodiment taken along the line 200—200 in FIG. 5.

A second embodiment of the present invention is now described with reference to FIGS. 5 and 6. According to the second embodiment, fourth- and fifth-layer internal unwired regions 16 of a macro cell part 12 are provided over the whole area of the macro cell part 12, dissimilarly to the aforementioned first embodiment. In other words, the macro cell part 12 is provided with no inhibit regions for wires in the second embodiment. The second embodiment is now described in detail.

A semiconductor integrated circuit 11 according to the second embodiment comprises the macro cell part 12 and a random logic part 13 provided around the macro cell part 12. Transistors 19 are formed on substrate surfaces of the macro cell part 12 and the random logic part 13. First- and second-layer metal wires 20a and 20b connect the transistors 19 with each other, thereby forming a logic circuit. Internal wiring regions 17 of the macro cell part 12 are formed on first, second and third layers. Internal wires 15a, 15b and 15c are provided on the first, second and third layers of the internal wiring regions 17 of the macro cell part 12 respectively.

Fourth and fifth layers of the macro cell part 12 entirely form internal unwired regions 16 with no internal wires.

The random logic part 13 is formed with five layers of metal wires 20a to 20e. Interlayer isolation films 14a, 14b, 14c, 14d and 14e isolate the five layers of metal wires 20a to 20e from each other respectively. Among the metal wires shown in FIG. 5, those in the vertical direction are formed by the fourth-layer metal wires 20d and those in the transverse direction are formed by the fifth-layer metal wires 20e. In a section shown in FIG. 6 taken along the line 200—200 in FIG. 5, therefore, the fourth-layer metal wire 20d of the random logic part 13 is formed in the fourth-layer internal unwired region 16 of the macro cell part 12.

According to the second embodiment, as hereinabove described, the internal unwired regions 16 of the macro cell part 12 are provided over the whole areas of the fourth and fifth layers of the macro cell part 12 so that the metal wires 20d and 20e of the random logic part 13 may not bypass the macro cell part 12 at all. Thus, the total wiring length of the metal wires 20d and 20e of the random logic part 13 can be further reduced as compared with that in the first embodiment, whereby wiring capacity can be more reduced. Consequently, circuit operations can be further speeded up. In addition, the metal wires 20d and 20e of the random logic part 13 may not bypass the macro cell part 12, whereby congestion of the wires around the macro cell part 12 can be more effectively prevented than the first embodiment. Consequently, the degree of integration of the semiconductor integrated circuit 11 can be more improved.

According to the second embodiment, the first to third layers of the macro cell part 12 can be set as the internal wiring regions 17 while setting the whole areas of the fourth and fifth layers of the macro cell part 12 as the internal unwired regions 16 by forming the macro cell part 12 in the multilayer wiring structure of five layers.

(Third Embodiment)

A third embodiment of the present invention is now described with reference to FIG. 7. The third embodiment is described with reference to a digital camera comprising an ASIC part 150 including the macro cell part and the random logic part according to the aforementioned first or second embodiment.

Figure 7:
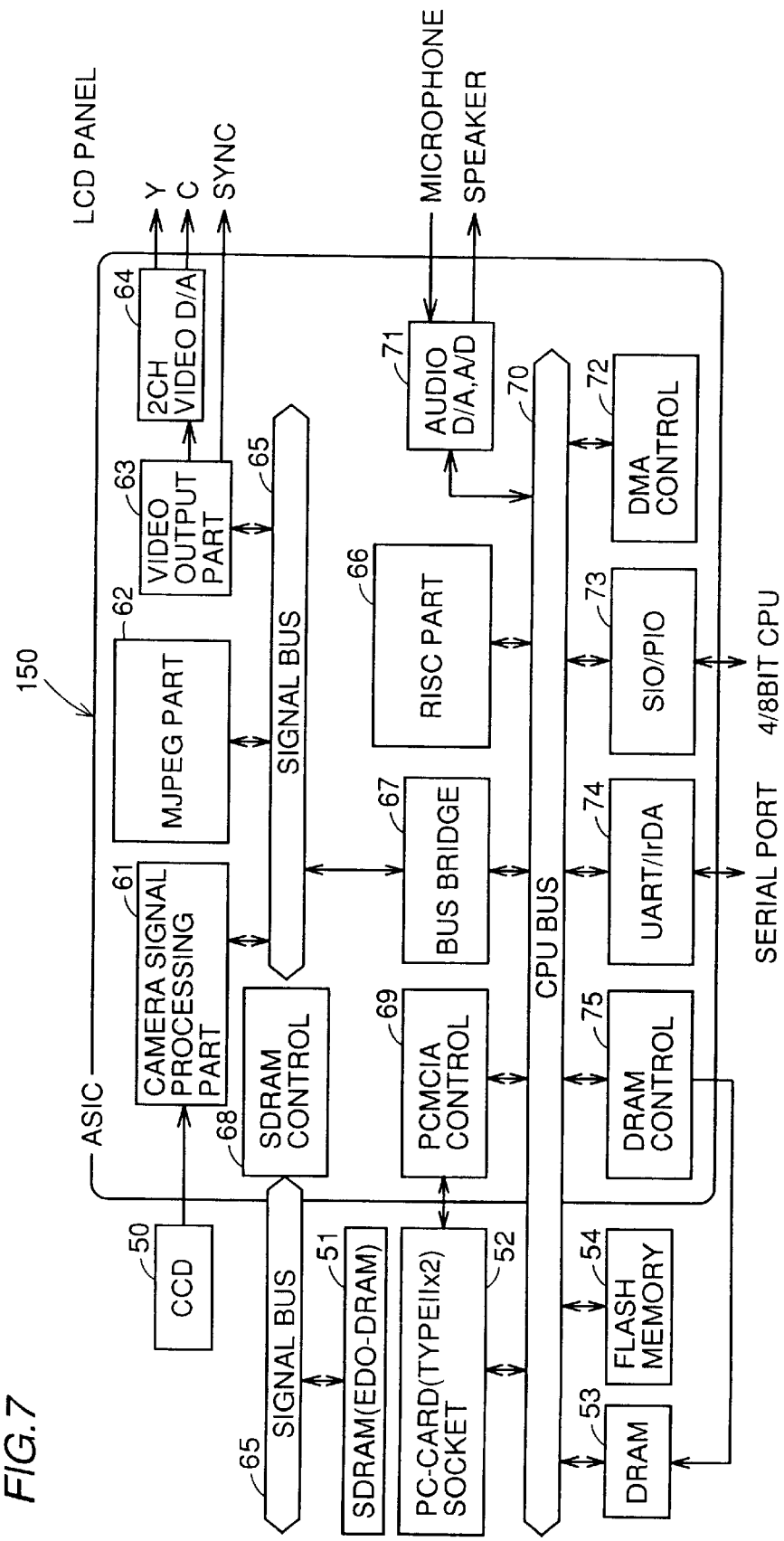
FIG. 7 is a block diagram showing the structure of a digital camera, comprising the semiconductor integrated circuit according to the first or second embodiment, according to a third embodiment of the present invention.

Referring to FIG. 7, the ASIC part 150 of this digital camera includes a camera signal processing part 61, an MJPEG part 62, a video output part 63, a video D-A converter 64, a signal bus 65, a RISC part 66, a bus bridge 67, an SDRAM control part 68, a PCMCIA control part 69, a CPU bus 70, an audio D-A/A-D converter 71, a DMA control part 72, an SIO/PIO part 73, an UART/IrDA part 74 and a DRAM control part 75.

In the aforementioned ASIC part 150, the RISC part 66 corresponds to the macro cell part according to the first or second embodiment. In the ASIC part 150, further, the remaining parts excluding the RISC part 66 correspond to the random logic part according to the first or second embodiment.

In the digital camera shown in FIG. 7, a CCD 50, an SDRAM 51, a PC card socket 52, a DRAM 53 and a flash memory 54 are arranged outside the ASIC part 150.

Photographing operations of the digital camera having the aforementioned structure are now described. As to the mechanism (signal flow) of the digital camera, the camera signal processing part 61 converts an image received from the CCD 50 to an electric signal. The camera signal processing part 61 performs processing of enhancing the contour of the acquired image for attaining clear appearance, adjusting color balance or focusing. The external SDRAM 51 stores image data subjected to such processing. This image data is displayed on a liquid crystal monitor through an NTSC encoder.

When the shutter of the digital camera is released, the image data is transferred to the MJPEG part 62 and compressed. The compressed code data is transferred to the RISC part (macro cell part) 66 and converted to a still picture file and thereafter stored in the flash memory 54. When reproducing a motion picture, 15 QVGA images are processed in a second for reproducing the motion picture. In reproduction, a still picture or a motion picture is projected on liquid crystals through a path opposite to the above. The RISC part 66 including a 32-bit RISC-CPU controls all these operations and processes sound in real time. As to the sound reproduced with the motion picture, the RISC part 66 data-processes sound received from a microphone and records the same in a single file along with the image data. A one-chip LSI (the ASIC part 150) performs all these operations, and this ASIC part 150 serves as the brain of the digital camera.

When applying the structure according to the first or second embodiment to the RISC part 66 of the ASIC part 150 of the digital camera according to the third embodiment, wires of the parts other than the RISC part 66 can be provided in the RISC part (macro cell part) 66. Thus, such a probability that the wires of the parts other than the RISC part 66 must bypass the RISC part 66 can be reduced or nullified. Thus, the total wiring length of the wires of the parts other than the RISC part 66 is so reduced that wiring capacity can be reduced while the wires can be prevented from congestion around the RISC part (macro cell part) 66. Consequently, it is possible to provide a digital camera capable of speeding up circuit operations and improving the degree of integration of a semiconductor integrated circuit.

Although the present invention has been described and illustrated in detail, it is clearly understood that the same is by way of illustration and example only and is not to be taken by way of limitation, the spirit and scope of the present invention being limited only by the terms of the appended claims.

While the internal unwired regions 6 of the macro cell part 2 are provided on the areas shown in FIG. 1 in the aforementioned first embodiment, for example, the present invention is not restricted to this but the internal unwired regions 6 may alternatively be set on other areas of the macro cell part 2 to attain a similar effect.

Figure 8:
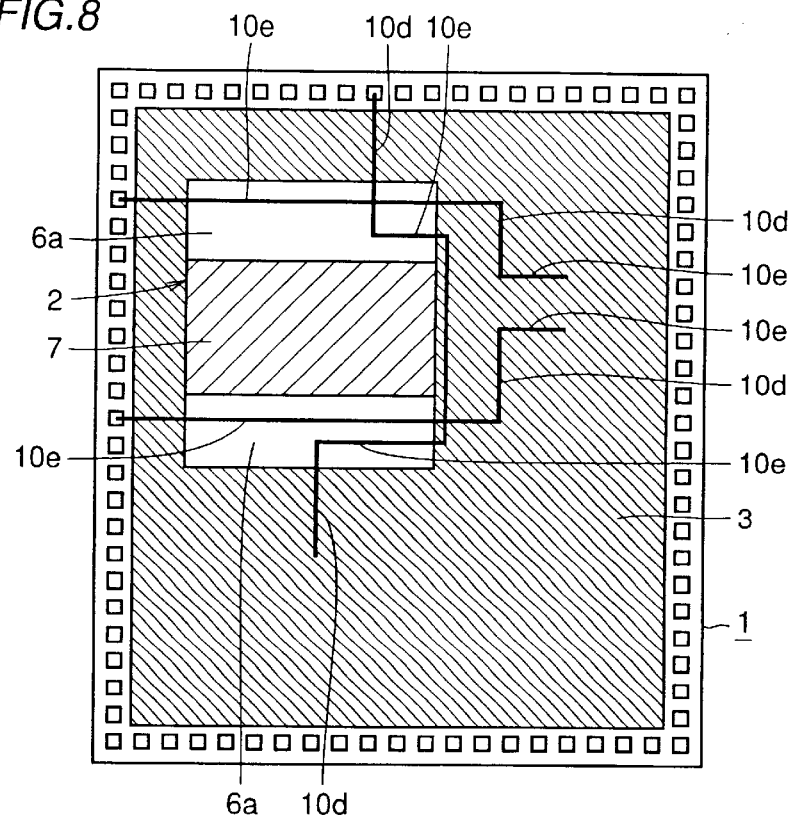
FIGS. 8 to 11 are plan views schematically showing the structures of modifications of the semiconductor integrated circuit according to the first embodiment shown in FIG. 1.
Figure 9:
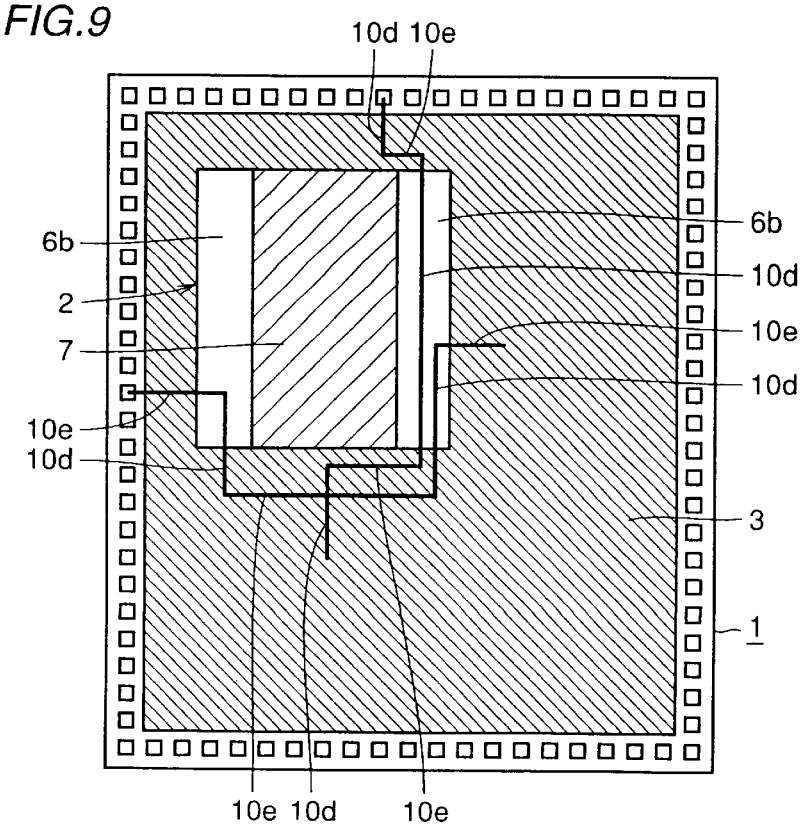
Figure 10:
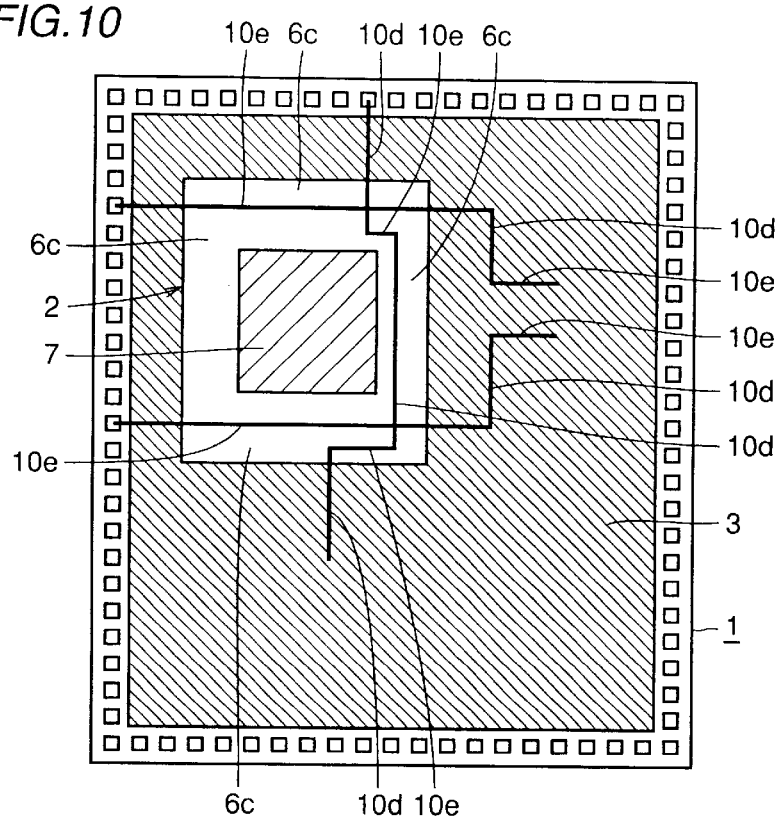
Figure 11:
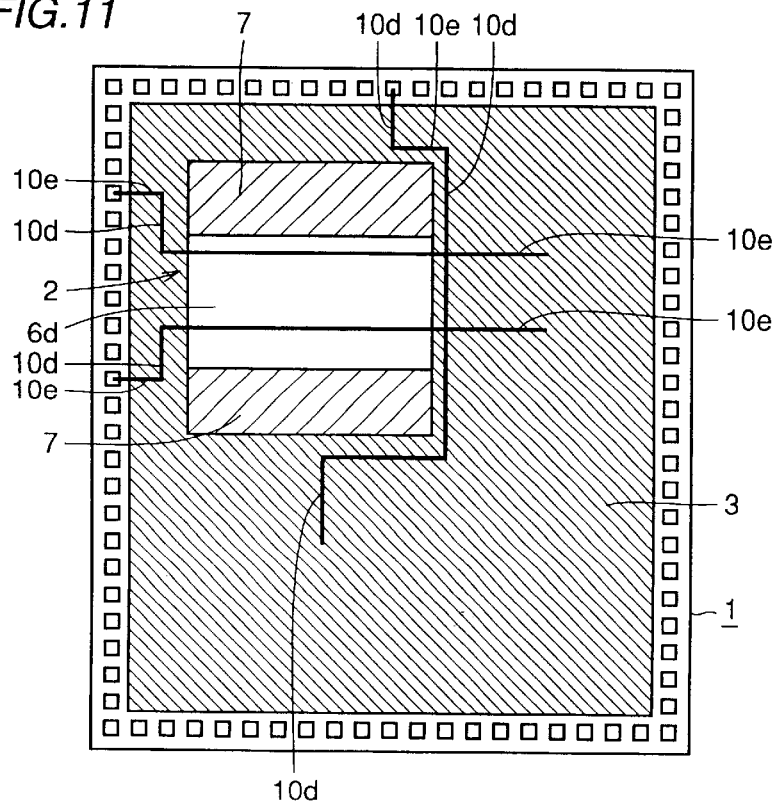
Figure 12:
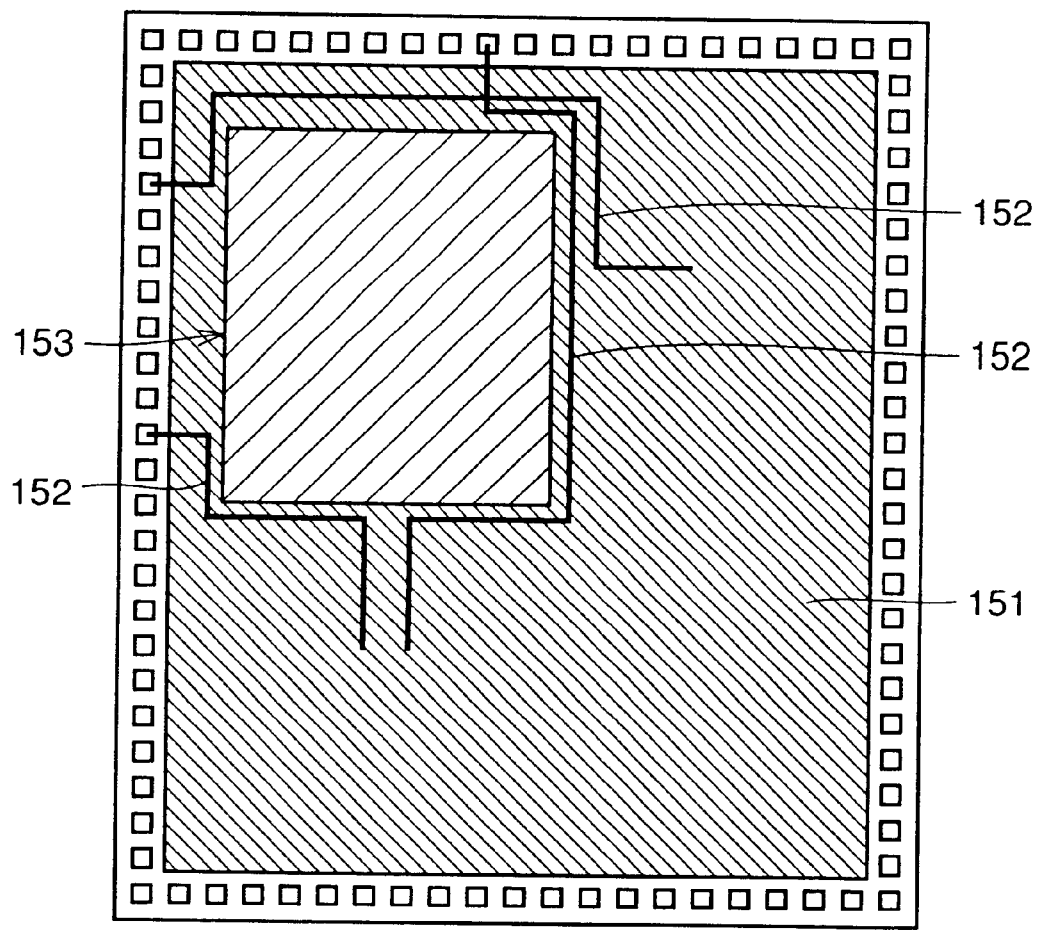
FIG. 12 is a plan view schematically showing the structure of a conventional semiconductor integrated circuit.

More specifically, internal unwired regions 6a may be formed on upper and lower edge portions of the macro cell part 2 with a constant width in the form of strips respectively, as shown in FIG. 8. Or, internal unwired regions 6b may be formed to extend along both side edge portions of the macro cell part 2 with a constant width, as shown in FIG. 9. Or, internal unwired regions 6c may be provided over the whole area of the peripheral portion of the macro cell part 2, as shown in FIG. 11. Further, internal unwired regions 6d may be formed on a central portion of the macro cell part 2 with a constant width in the form of strips, as shown in FIG. 11. However, the internal wires of the macro cell part 2 tend to congest rather on the central portion than on the peripheral portion, and hence the macro cell part 2 itself can advantageously be readily designed when the internal unwired regions are provided on the peripheral portion or corner portions of the macro cell part as in the first embodiment shown in FIG. 1 or any of the modifications shown in FIGS. 8 to 10.

While the internal unwired regions are formed on the fourth and fifth layers of the macro cell part in each of the aforementioned first and second embodiments, the present invention is not restricted to this but the internal unwired regions may be formed on other layers. For example, the internal unwired regions may be formed only on the third layer, on the second and third layers, or on the third and fourth layers.

While the internal unwired regions are provided over two layers in each of the aforementioned first and second embodiments, the present invention is not restricted to this but the internal unwired regions may alternatively be provided over at least three layers of the macro cell part. Thus, congestion of metal wires around the macro cell part can be further relaxed.

While each of the macro cell part and the random logic part has a five-layer structure in each of the aforementioned embodiments, the present invention is not restricted to this but a multilayer wiring structure having a different number of layers is also employable.

What is claimed is:

1. A semiconductor integrated circuit comprising:
    a macro cell part; and
    a logic part formed around said macro cell part, wherein
    said macro cell part includes a logic wiring region for receiving a wire provided in said logic part.

2. The semiconductor integrated circuit according to claim 1, wherein
    said logic wiring region of said macro cell part includes a region substantially provided with no internal wire of said macro cell part.

3. The semiconductor integrated circuit according to claim 1, wherein
    said logic wiring region of said macro cell part includes a region provided with an internal wire of said macro cell part to an extent not hindering provision of said wire of said logic part.

4. The semiconductor integrated circuit according to claim 1, wherein
    said logic wiring region of said macro cell part is provided on a peripheral portion of said macro cell part.

5. The semiconductor integrated circuit according to claim 4, wherein
    said logic wiring region is provided on a corner portion, an upper edge portion and a lower edge portion of said macro cell part.

6. The semiconductor integrated circuit according to claim 4, wherein
    said logic wiring region is provided along a peripheral portion of said macro cell part over the whole area of said peripheral portion.

7. The semiconductor integrated circuit according to claim 4, wherein
    said logic wiring region is provided on a corner portion and both side edge portions of said macro cell part.

8. The semiconductor integrated circuit according to claim 1, wherein
    said logic wiring region of said macro cell part is provided on a central portion of said macro cell part in the form of a strip.

9. The semiconductor integrated circuit according to claim 1, wherein
    each of said macro cell part and said logic part has a multilayer wiring structure, and
    said logic wiring region is formed on at least one layer of said macro cell part.

10. The semiconductor integrated circuit according to claim 9, wherein
    said logic wiring region is provided over a plurality of layers of said macro cell part.

11. The semiconductor integrated circuit according to claim 1, wherein
    each of said macro cell part and said logic part has a multilayer wiring structure, and
    said logic wiring region is provided substantially over the whole area of a prescribed layer of said macro cell part.

12. The semiconductor integrated circuit according to claim 1, wherein
    each of said macro cell part and said logic part has a multilayer wiring structure, and
    said wire of said logic part provided on said logic wiring region of said macro cell part and an internal wire of said macro cell part are prepared from the same layer.

13. The semiconductor integrated circuit according to claim 1, wherein
    each of said macro cell part and said logic part has a multilayer wiring structure, and
    an underlayer surface for said wire of said logic part provided on said logic wiring region of said macro cell part and the upper surface of said logic wiring region of said macro cell part are substantially flush with each other.

14. A digital camera comprising a semiconductor integrated circuit, including:
    a macro cell part, and
    a logic part formed around said macro cell part, wherein
    said macro cell part has a logic wiring region for receiving a wire provided in said logic part.

* * * * *